(12) United States Patent
Koike et al.

(10) Patent No.: US 9,182,103 B2
(45) Date of Patent: Nov. 10, 2015

(54) LASER LIGHT SOURCE DEVICE

(71) Applicant: STANLEY ELECTRIC CO., LTD., Tokyo (JP)

(72) Inventors: Teruo Koike, Chigasaki (JP); Ji-Hao Liang, Kaqwasaki (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 237 days.

(21) Appl. No.: 13/680,424

(22) Filed: Nov. 19, 2012

(65) Prior Publication Data

US 2013/0128584 A1 May 23, 2013

(30) Foreign Application Priority Data

Nov. 22, 2011 (JP) ................................. 2011-254936

(51) Int. Cl.
*F21V 9/00* (2015.01)
*H01S 3/00* (2006.01)
*B60Q 1/00* (2006.01)
*F21V 13/04* (2006.01)
*H01S 5/00* (2006.01)
*H01S 5/022* (2006.01)

(52) U.S. Cl.
CPC ............. *F21V 13/04* (2013.01); *H01S 5/02288* (2013.01); *H01S 5/0092* (2013.01); *H01S 5/0228* (2013.01); *H01S 5/02212* (2013.01)

(58) Field of Classification Search
CPC . H01S 5/0092; H01S 5/02212; H01S 5/0228; H01S 5/02288; G02B 6/0071; F21V 13/04
USPC .......... 362/259, 293, 551, 553, 487, 507, 538
See application file for complete search history.

(56) References Cited

U.S. PATENT DOCUMENTS

| | | |
|---|---|---|
| 6,179,445 B1 * | 1/2001 | Naoe et al. .................... 362/259 |
| 6,795,243 B1 * | 9/2004 | McGettigan et al. ..... 359/485.05 |
| 7,370,997 B2 | 5/2008 | Komatsu |

(Continued)

FOREIGN PATENT DOCUMENTS

| | | |
|---|---|---|
| JP | 2005267998 A | 9/2005 |
| JP | 2008-010228 A | 1/2008 |

(Continued)

OTHER PUBLICATIONS

Japanese Office Action (and English translation thereof) dated Jul. 28, 2015, issued in counterpart Japanese Application No. 2011-254936.

*Primary Examiner* — Evan Dzierzynskiu
*Assistant Examiner* — Naomi M Wolford
(74) *Attorney, Agent, or Firm* — Holtz, Holtz, Goodman & Chick PC

(57) ABSTRACT

In an exemplary embodiment, a laser light source device includes a laser light source that emits laser light from a laser emission aperture. The laser light source device also includes a condenser lens disposed in front of the laser light source in a laser emission direction to collect the laser light. The laser light source device also includes a fluorescent member disposed in front of the condenser lens in the laser emission direction to receive the laser light collected by the condenser lens and to emit light of a different wavelength from that of the laser light. The laser light source device also includes a light guide that forms a light path of laser light from the laser light source to the condenser lens.

16 Claims, 12 Drawing Sheets

(56) References Cited

U.S. PATENT DOCUMENTS

| | | |
|---|---|---|
| 8,152,346 B2 | 4/2012 | Yatsuda |
| 2010/0128187 A1* | 5/2010 | Brott et al. ............... 349/15 |
| 2010/0172148 A1* | 7/2010 | Komazaki et al. ......... 362/551 |
| 2011/0013145 A1* | 1/2011 | Kato ........................ 353/20 |
| 2011/0280032 A1* | 11/2011 | Kishimoto ................. 362/538 |

FOREIGN PATENT DOCUMENTS

| | | |
|---|---|---|
| JP | 2010049886 A | 3/2010 |
| JP | 2011129375 A | 6/2011 |

* cited by examiner

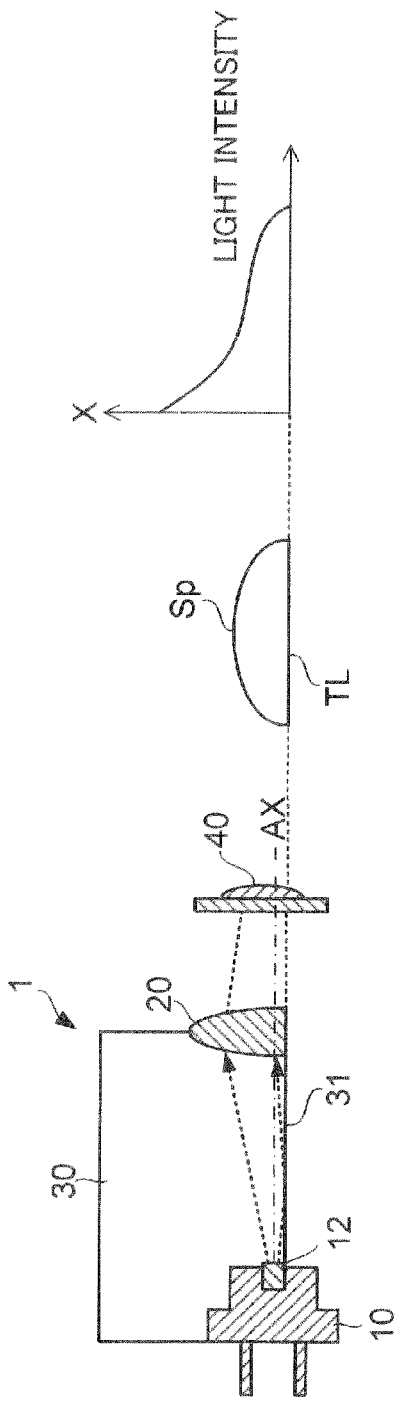
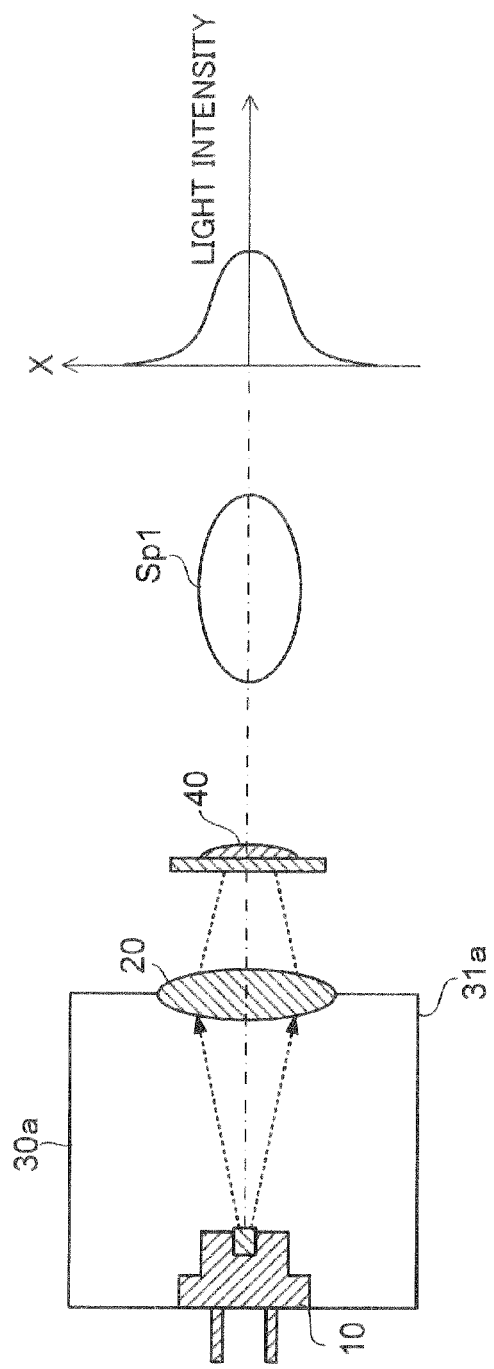

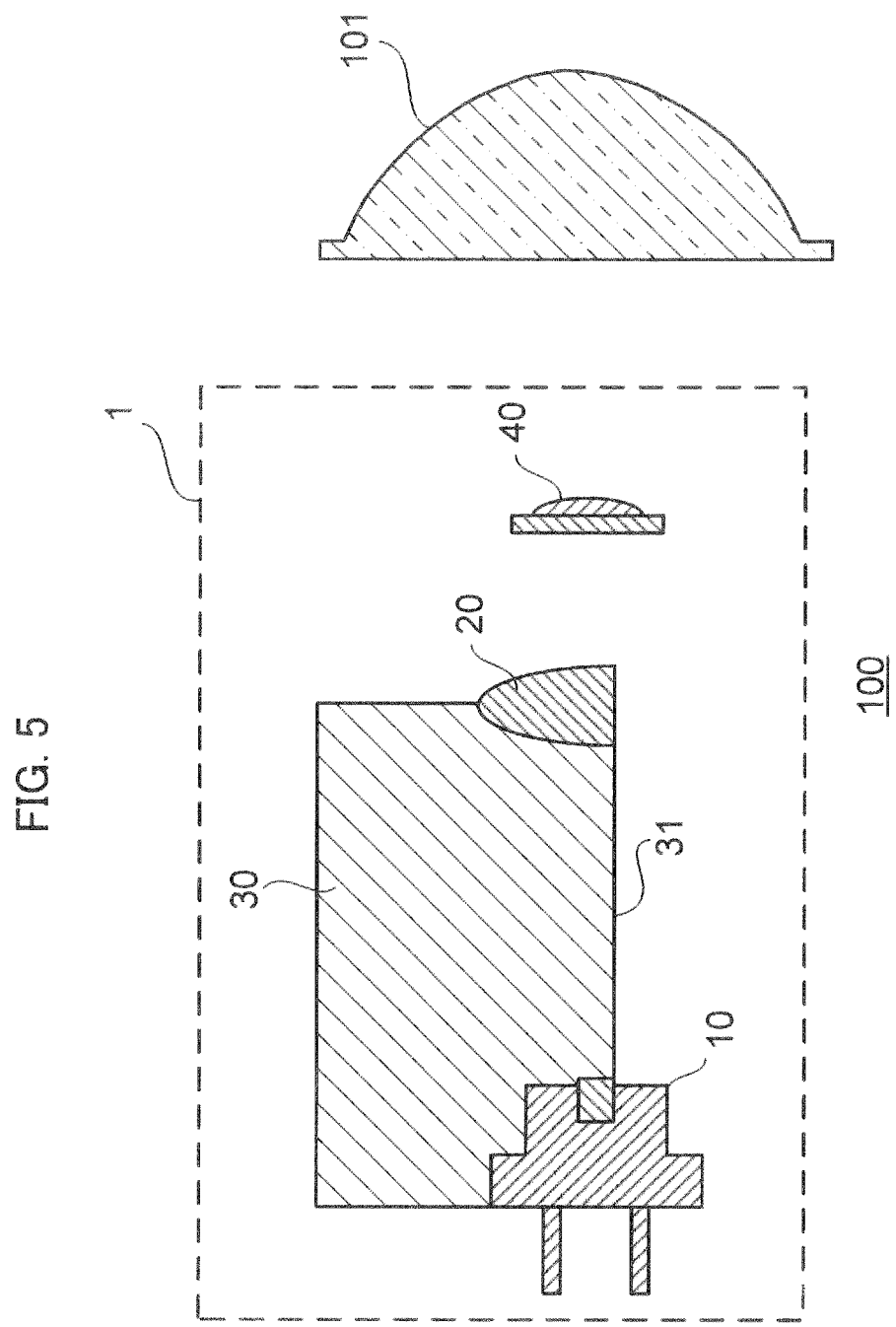

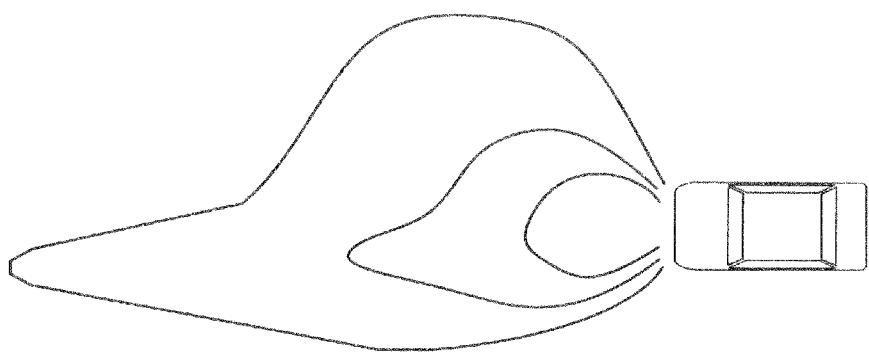
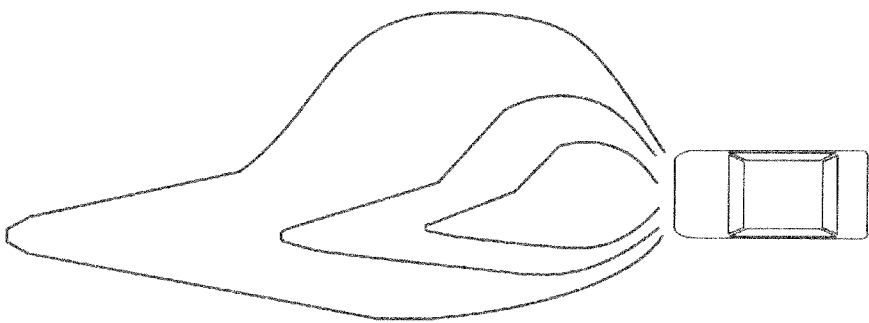

LASER LIGHT SOURCE DEVICE

BACKGROUND OF THE INVENTION

1. Field of the Invention

The present invention relates to a laser light source device that uses a laser light source.

2. Description of the Related Art

Vehicle lamps require a high brightness light source in order to illuminate a long distance with a sufficient intensity of light. Vehicle lamps having a laser light source device have been proposed in recent years, which combine a semiconductor laser that emits blue laser light and a fluorescent member that emits light when excited by the blue laser light from the semiconductor laser.

Japanese Patent Application Publication (Kokai) No. 2008-10228 describes a laser light source device. This laser source device includes a surface emitting laser element having a plurality of light emitting parts arranged on the surface of the surface emitting laser element, a mask having mask apertures formed in the surface of the surface emitting laser element to expose the light emitting parts, and a fluorescent member filled inside the mask apertures.

FIG. 1A of the accompanying drawings shows the shape of a beam spot Sp1 formed by laser light emitted from a common laser diode 200 on a projection surface orthogonal to the optical axis of the laser light. FIG. 1B of the accompanying drawings shows the brightness distribution of the beam spot. As depicted in FIG. 1A, the beam spot Sp1 has an oval shape, its width $A_H$ in direction X parallel to a pn joint surface of the laser diode 200 being smaller than the width $A_V$ in direction Y vertical to the pn joint surface. As shown in FIG. 1B, the light intensity distribution of the beam spot Sp1 is a symmetric Gaussian distribution, wherein the light intensity is the highest at the optical axis center, and decreases smoothly outward from the optical axis center.

The laser light source device used in a vehicle lamp generates white light by irradiating light having such a Gaussian light intensity distribution to the fluorescent member through a condenser lens. The white light also has a Gaussian light intensity distribution, so that the light intensity at both ends of the light emission area is relatively low. In vehicle lamp applications, an optical system including a lens and a reflector is used to project light from the light source onto the road surface. The illuminance on the road surface is inversely proportional to the square of the distance from the light source. Thus, if end areas of the light source that illuminate a distant road surface have a relatively low brightness, the illuminance of the distant road surface will be lower than that near the vehicle. As a result, the bright/dark boundary commonly referred to as a "cutoff line" will be blurry, and the visibility in a distance will be low. For this reason, commonly, a light shield member such as a shade is provided in front of the light source to shut off part of light from the light source to make the bright/dark boundary clearer. This, however, significantly lowers the light utilization efficiency. Some laser diodes have a beam spot that is not oval as that of the surface emitting laser shown in FIG. 1A, but they have the same problem because they have a similar light intensity distribution in which the light intensity is highest at the optical axis and smoothly decreases outward.

SUMMARY OF THE INVENTION

One object of the present invention is to provide a laser light source device capable of improving long distance visibility when applied to vehicle lamps and the like without reducing the light utilization efficiency.

According to one aspect of the present invention, there is provided a laser light source device that includes a laser light source that emits laser light from a laser emission aperture thereof, and a condenser lens disposed in front of the laser light source in a laser emission direction to collect the laser light. The laser light source device also includes a reflective surface element that is provided between the laser light source and the condenser lens such that a reflective surface extends along an optical axis of the laser light at a position outer than the laser emission aperture. The reflective surface element may be a light guide, and the reflective surface may be a lateral face of the light guide.

According to another aspect of the present invention, there is provided another laser light source device that includes a laser light source that emits laser light from a laser emission aperture thereof, and a wavelength converter disposed in front of the laser light source in a laser emission direction to receive the laser light and to emit light of a different wavelength from that of the laser light. The laser light source device also includes a reflective surface element that is provided between the laser light source and the wavelength converter such that a reflective surface extends along an optical axis of the laser light at a position outer than the laser emission aperture. The reflective surface element may be a light guide, and the reflective surface may be a lateral face of the light guide.

When laser light from the light source propagates through the light guide, the laser light is reflected by a lateral face of the light guide parallel to the optical axis by total reflection. The light turned back by the lateral face of the light guide is overlaid on the beam spot formed on a light receiving surface of a fluorescent member. Thus, the brightness can be increased at an end of the emission area of the fluorescent member corresponding to the lateral face of the light guide.

These and other objects, aspects and advantages of the present invention will become apparent to those skilled in the art from the following detailed description when read and understood in conjunction with the appended claims and drawings.

BRIEF DESCRIPTION OF THE DRAWINGS

FIG. 4A illustrates the courses of laser light propagating through a light guide of the laser light source device shown in FIG. 2, together with the shape of a beam spot formed on a light receiving surface of a fluorescent member, and the light intensity distribution of the beam spot, aligned side by side;

FIG. 4B is similar to FIG. 4A and illustrates the laser light propagating through a light guide according to a comparative example, together the beam spot shape and the light intensity distribution of the beam spot;

FIG. 5 shows the configuration of a direct projection-type vehicle lamp having the laser light source device shown in FIG. 2;

FIG. 7A is an iso-illuminance curve of the vehicle lamp shown in FIG. 6, which is installed in a vehicle to illuminate a road surface;

FIG. 7B is similar to FIG. 7A and illustrates an iso-illuminance curve of a comparative example;

DETAILED DESCRIPTION OF THE INVENTION

Figure 1A:
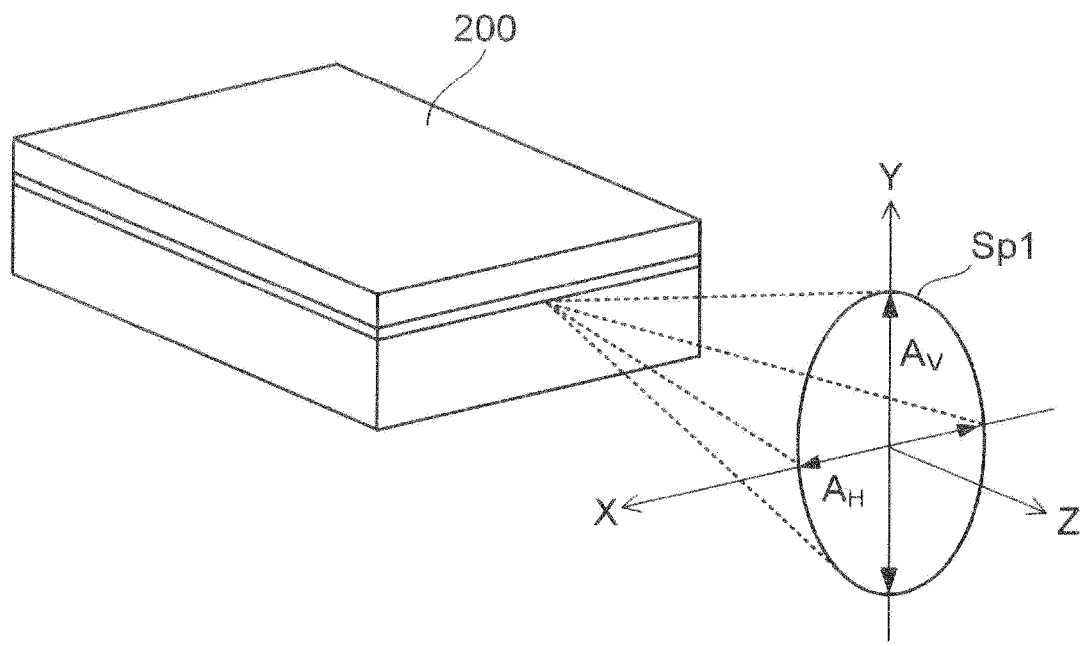
FIG. 1A illustrates a beam spot formed by laser light emitted from a common laser diode.

Hereinafter, embodiments of the present invention will be described with reference to the accompanying drawings. In the drawings, similar elements, components and parts are designated by similar reference numerals.

Embodiment 1

Figure 2:
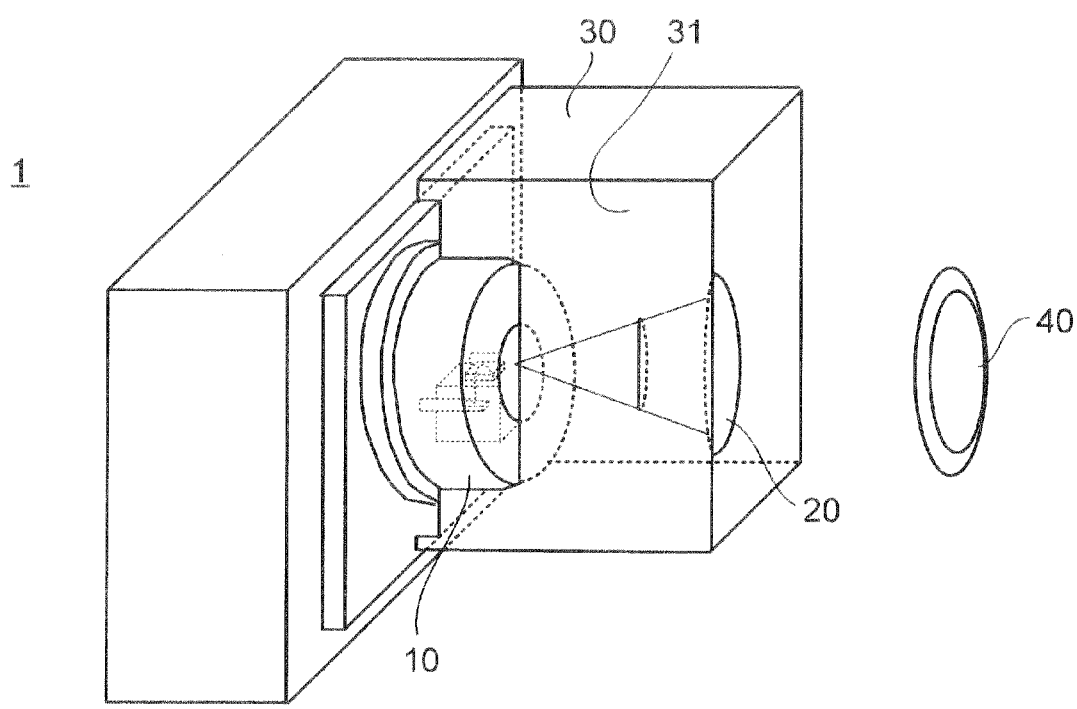
FIG. 2 is a perspective view of a laser light source device according to Embodiment 1 of the present invention.
Figure 3A:
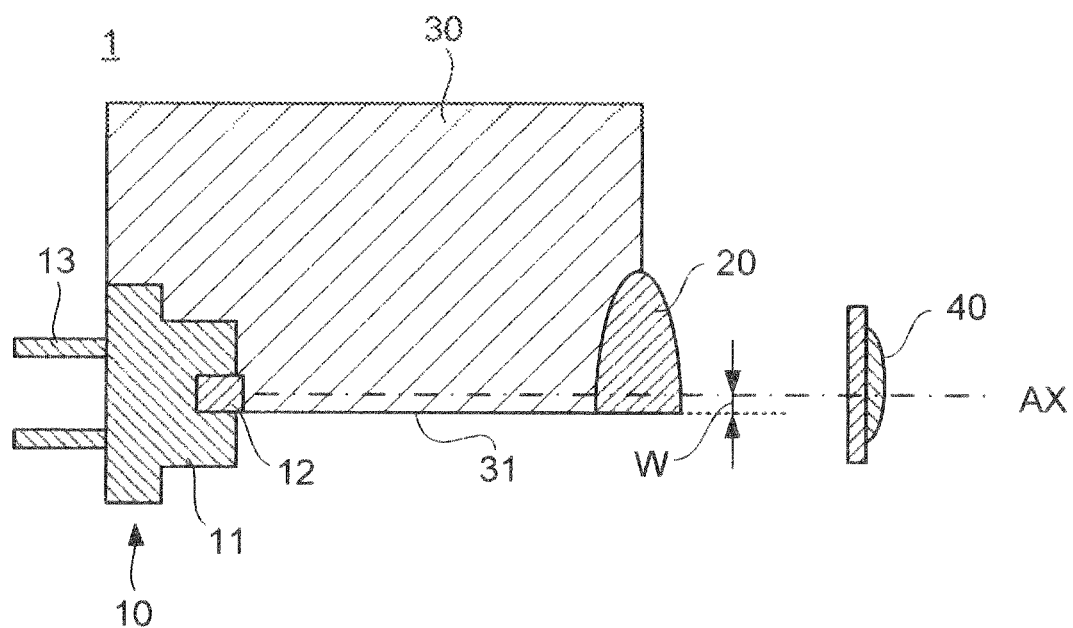
FIG. 3A is a cross-sectional view of the laser light source device shown in FIG. 2.
Figure 3B:
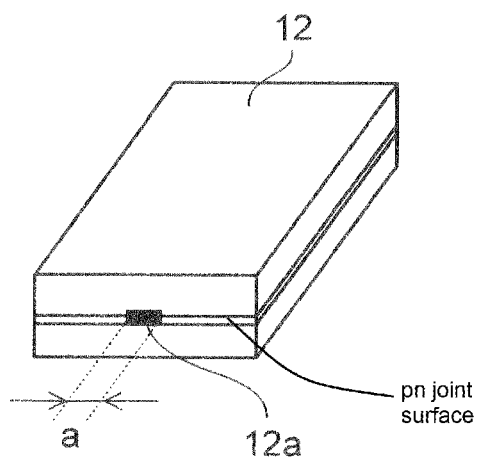
FIG. 3B is a perspective view of a laser diode of the laser light source device shown in FIG. 3A.

Referring first to FIGS. 2, 3A and 3B, a laser light source device 1 according to the first embodiment of the present invention will be described. FIG. 3A is a cross-sectional view of major parts of the laser light source device 1. FIG. 3B is a perspective view of a laser diode 12 of a semiconductor laser 10.

The semiconductor laser 10 is a device that generates laser light (i.e., light source). The semiconductor laser 10 has a heat sink 11, the laser diode 12 mounted on the heat sink 11, and leads 13 connected to the heat sink 11. The laser diode 12 includes a nitride semiconductor layer such as GaN, for example, and emits blue laser light having a wavelength of about 450 nm from a laser emission aperture 12a in a laser emission end face. The laser emission aperture 12a has a width of about 100 μm (micrometer), for example.

A condenser lens 20 is arranged in front of the semiconductor laser 10 in the laser emission direction to receive laser light. The condenser lens 20 collects laser light emitted from the semiconductor laser 10 and forms a beam spot on a light receiving surface of a laser fluorescent member 40.

A light guide 30 is a light transmissive member that forms the optical path of laser light from the semiconductor laser 10 to the condenser lens 20. Namely, the light guide 30 fills up the space between the semiconductor laser 10 and the condenser lens 20. The light emitted from the semiconductor laser 10 enters and propagates in the light guide 30, and reaches the condenser lens 20. The light guide 30 may be formed of a material having a higher index of refraction than the surrounding air, such as glass or resin, for example. The semiconductor laser 10 and the condenser lens 20 may be partly embedded in the light guide 30, as shown in FIG. 2 and FIG. 3A. Alternatively, only one of the laser 10 and lens 20 may be embedded in the light guide 30.

The light guide 30 has a lateral face 31 that is located at a position outer than the laser emission aperture 12a and extends parallel to the optical axis of the laser light. It can be said that the lateral face 31 of the light guide 30 extends along the optical axis of the laser light. The lateral face 31 of the light guide 30 is preferably located close to the optical axis center AX, for example at a distance W of 150 μm from the optical axis center AX. If the distance W between the optical axis center AX and the lateral face 31 of the light guide 30 were zero, about half of the light emitted from the laser emission aperture 12a would leak to the outside of the light guide 30. The light guide 30 completely overlaps the laser emission aperture 12a so that all the light emitted from the laser emission aperture 12a enters the light guide 30 without any such leak of light. As such, the lateral face 31 of the light guide 30 is located at a position outer than the laser emission aperture 12a. The lateral face 31 of the light guide 30 is also preferably orthogonal to the pn joint surface of the laser diode 12. The light guide 30 may have a rectangular prism shape as shown in FIG. 2. It is not desirable that the laser light spreading in a region on the opposite side from the lateral face 31 relative to the optical axis reach the condenser lens 20 by reflection. In order to prevent light from being reflected in this way, therefore, the surface opposite the lateral face 31 of the light guide 30 is preferably processed to be antireflective, for example by providing (attaching) a light absorbing film, or, be distanced 5 mm (millimeter) or more, for example, from the optical axis, so that light within the half width at half maximum (HWHM) angle range spreading in the region opposite from the lateral face 31 will reach the condenser lens 20 without being reflected. Therefore, the condenser lens 20 is preferably located and dimensioned such that light within the HWHM angle range spreading on the side of the lateral face 31 will reach the condenser lens 20 after being reflected once by the lateral face 31, and light within the HWHM angle range spreading in the region opposite from the lateral face 31 will reach the condenser lens 20 without being reflected. The condenser lens 20 extends to the lateral face 31 of the light guide 30 so that light that reaches near the lateral face 31 of the light guide 30 can be taken in.

The fluorescent member (wavelength converter) 40 is arranged near the focal point in front of the condenser lens 20 in the laser emission direction, and receives the laser light collected by the condenser lens 20 on its light receiving surface. The fluorescent member 40 is formed of a YAG:Ce fluorescent substance dispersed in a light transmissive resin binder such as silicone resin, for example. The fluorescent member 40 absorbs blue light of about 450 nm wavelength emitted from the semiconductor laser 10, and converts this light to yellow light that has an emission peak at around 560 nm wavelength, for example. The yellow light produced by wavelength conversion by the fluorescent member 40 mixes with the blue light that has transmitted through the fluorescent member 40 without its wavelength being converted. As a result, white light is emitted from a light exit surface of the fluorescent member 40. The fluorescent member 40 may have a heat dissipation plate joined thereto so as to diffuse the heat generated when converting the wavelength of light.

FIG. 4A illustrates the course of laser light propagating through the light guide 30 according to the embodiment of the present invention, the shape of a beam spot (emission area) Sp formed on the light receiving surface of the fluorescent member 40, and the light intensity distribution of the beam spot Sp, aligned side by side. FIG. 4B illustrates a comparative example where the lateral face 31a of the light guide 30a is located a sufficient distance from the optical axis center AX. Similar to FIG. 4A, FIG. 4B depicts the course of laser light propagating through the light guide 30a, the shape of a beam spot (emission area) Sp1 formed on the light receiving surface of the fluorescent member 40, and the light intensity distribution of the beam spot Sp1, aligned side by side. In FIG. 4B, the lateral face 31a is located such that the laser light reaches the condenser lens 20 without being reflected. In the configuration of FIG. 4B, the beam spot Sp1 and the light intensity distribution are the same as the conventional ones shown in FIG. 1, the beam spot Sp1 being oval and the light intensity changes being smooth. On the other hand, in FIG. 4A, the laser light emitted from the semiconductor laser 10 spreads from the optical axis center AX as it propagates through the light guide 30. As the light guide 30 is formed of a material having a higher index of refraction than the surrounding air, the laser light entering the lateral face 31 of the light guide 30 at an angle of an optimal angle (critical angle) or more is reflected by the lateral face 31 of the light guide by total reflection. If the light transmissive material of the light guide 30 has a refractive index of 1.45 and the air has a refractive index of 1.0, then the optimal angle will be 41.8° (degrees). Since the lateral face 31 of the light guide 30 is parallel to the optical axis center AX and located close to the optical axis center AX, almost all the light beam directly entering the lateral face 31 of the light guide 30 is reflected by the lateral face 31 by total reflection. Accordingly, there is almost no light emitted to the outside from the lateral face 31 of the light guide 30.

A beam spot (emission area) Sp is formed on the light receiving surface of the fluorescent member 40 by the overlapping of two light beams, i.e., direct light beam from the semiconductor laser 10 and reflection light beam reflected by the lateral face 31 of the light guide 30. The beam spot (emission area) Sp formed by the light turning from the lateral face 31 of the light guide in this manner has an oval shape partly cut along the line corresponding to the lateral face 31 of the light guide 30. More specifically, because the lateral face 31 of the light guide 30 is arranged parallel to the optical axis and vertical to the pn joint surface of the laser diode 12, the beam spot Sp has a long oval shape cut along a line parallel to its major axis. Hereinafter, this cut line of the beam spot (emission area) Sp determined by the lateral face 31 of the light guide will be referred to as a turn back line TL. As the beam spot Sp is formed by the overlaying of the direct light beam and reflection light beam, the light intensity of the beam spot (emission area) Sp is increased or enhanced. The light intensity is made particularly high (enhanced) at an end of the beam spot (emission area) Sp, i.e., near the turn back line TL. If the laser light has a full width at half maximum (FWHM) angle $\theta_H$ of 16° (degrees), for example, about half of the laser light emitted from the semiconductor laser 10 is turned back by the lateral face 31 of the light guide 30 by arranging the lateral face 31 of the light guide 30 at a distance W of about 150 μm (micrometer) from the optical axis center AX. As a result, created is a beam spot Sp having a light intensity peak on the turn back line TL (at an end of the emission area), with the peak intensity being as high as about twice higher than normal. The fluorescent member 40 emits white light from its light exit surface with a light intensity distribution corresponding to the light intensity distribution of the beam spot Sp formed on its light receiving surface. As such, the laser light source device 1 of this embodiment is capable of generating light having a brightness profile with a sharp increase of light intensity toward the turn back line TL which is at an end of the emission area.

Referring to FIG. 5, a direct projection-type vehicle lamp 100 will be described. The lamp 100 is installed in a vehicle and employs the laser light source device 1 of the first embodiment as the light source. The laser light source device 1 is disposed such that the lateral face 31 of the light guide 30 faces downward in the vertical direction. A non-spherical lens 101 is arranged in front of the laser light source device 1 in the light projection direction. The white light emitted from the fluorescent member 40 of the laser light source device 1 is directly projected to the non-spherical lens 101. The non-spherical lens 101 inverts the image of light projected from the laser light source device 1 upside down and projects that image in a larger scale toward the front in the light projection direction.

Figure 6:
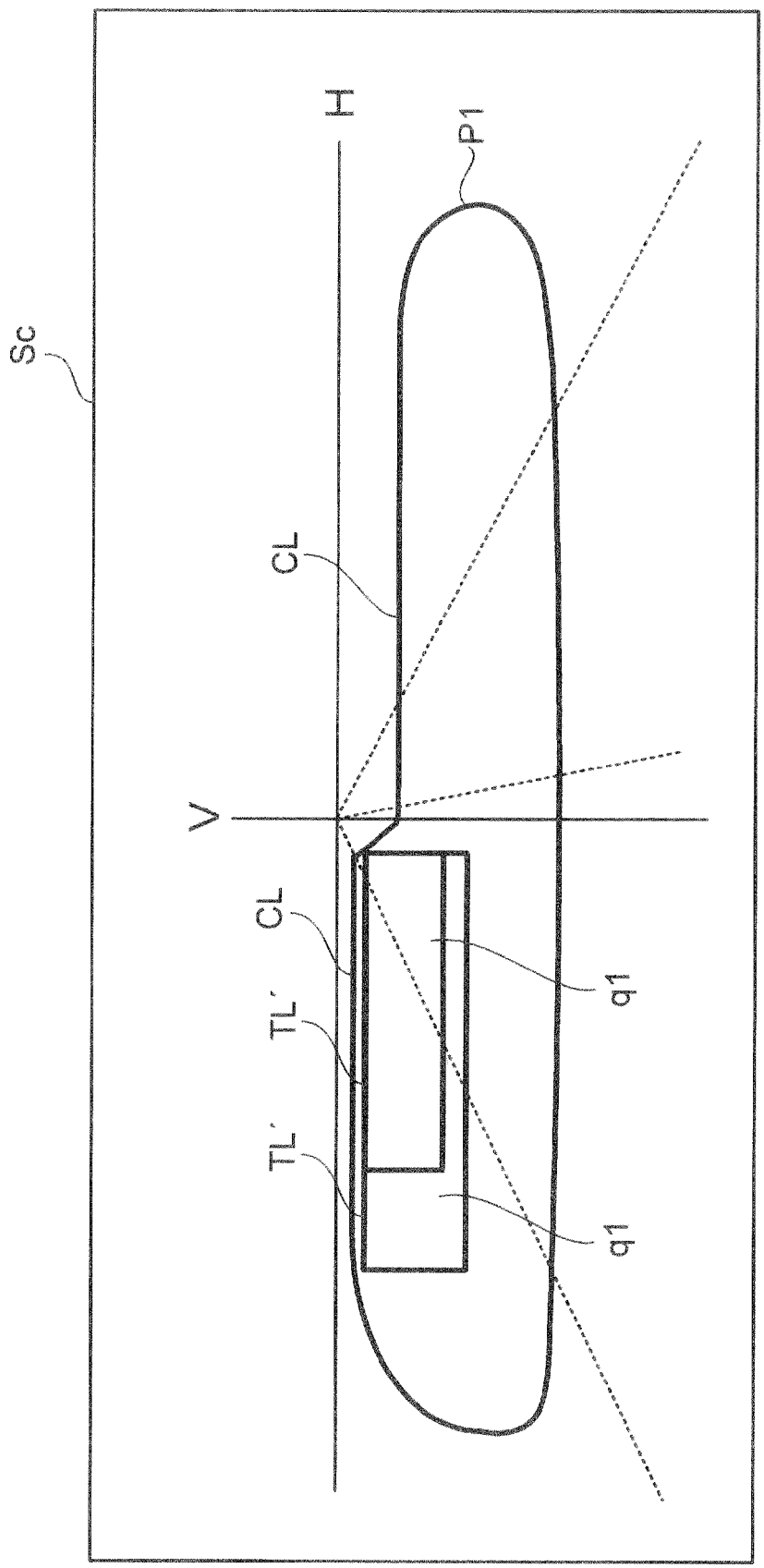
FIG. 6 shows the light distribution pattern of the vehicle lamp shown in FIG. 5.

Referring to FIG. 6, the light distribution pattern P of the vehicle lamp 100 on a screen Sc will be described. This light distribution pattern P is obtained when the light is projected from the vehicle lamp 100 onto the screen Sc placed in front of the lamp 100 in the light projection direction. In FIG. 6, H represents a horizontal line, and V represents a vertical line. The broken lines represent an imaginary road surface extending toward the front in the light projection direction. The cutoff line is positioned lower in the vertical direction on the opposite lane side than the cut off line on the side of the lane of the car, and the light distribution pattern P is suitable for low beam illumination. The non-spherical lens 101 of the vehicle lamp 100 forms a plurality of projected images q1 on the screen such that image portions TL' corresponding to the turn back line TL of the beam spot Sp shown in FIG. 4A are aligned with the cutoff line CL. Since the light intensity has a peak on the turn back line TL in the beam spot (emission area) Sp of the laser light source device 1 of this embodiment, the illuminance of light has a peak near the cutoff line CL. Thus, the light source device 1 creates a light distribution pattern P in which the vicinity of the cutoff line CL is the brightest and the illuminance decreases downwards in the vertical direction. Moreover, since the obtained light intensity is almost twice higher at the turn back line TL of the beam spot (emission area) Sp than the conventional peak intensity due to the light turning back effect, the illuminance near the cutoff line CL is made higher than that of the conventional light source device. As a result, the light distribution pattern P shows a more distinct difference between bright parts (bright area) and dark parts (dark area) at the cutoff line CL, even without using a light shield member such as a shade. Note that the cutoff line CL extends between the bright area and the dark area.

FIG. 7A is an iso-illuminance curve of the vehicle lamp 100 when the lamp 100 illuminates a road surface. FIG. 7B shows a comparative example, and is an iso-illuminance curve of a vehicle lamp using a conventional light source device that projects light having a Gaussian light intensity distribution onto a fluorescent member through a condenser lens to achieve white light. With the vehicle lamp 100 having the laser light source device 1 of this embodiment, the illuminance can be increased near the cutoff line CL as compared to the conventional lamp (FIG. 7B), as described above, and the iso-illuminance curve extends farther than that of the conventional one. Accordingly, the long distance visibility is significantly improved by use of the light source device 1. It is known that the illuminance on the road surface is inversely proportional to the square of the distance from the light source. Thus, the light source device 1 that emits light having an intensity peak on the turn back line TL which is at an end of the emission area compensates for the decrease in illuminance in a long distance. In other words, since the light source device is configured to have a brightness distribution with a sharp increase in intensity toward the turn back line TL, the laser light source device 1 is capable of illuminating the road surface from near the vehicle to a long distance with substantially uniform illuminance. This increases safety while driving at night.

The arrangement of the lateral face 31 of the light guide 30 in the laser light source device 1 of this embodiment will be described below.

Figure 1B:
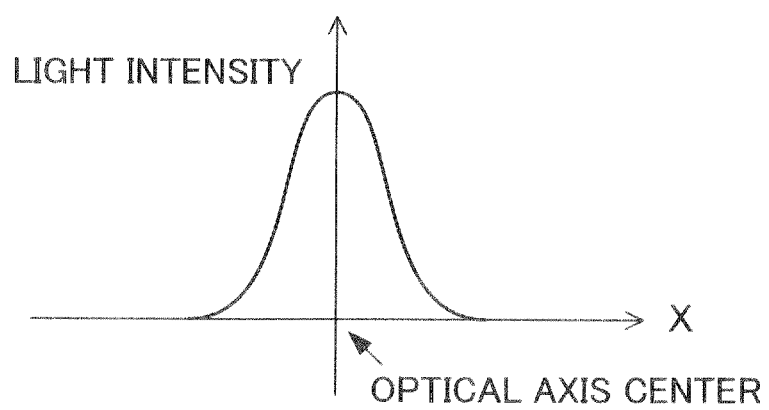
FIG. 1B is a diagram showing the brightness distribution of the beam spot of FIG. 1A.

The lateral face 31 of the light guide 30 is arranged to be parallel to the optical axis of the laser light emitted from the semiconductor laser 10 and vertical to the pn joint surface of the laser diode 12. The beam spot typically has an oval shape as shown in FIG. 1A. By arranging the lateral face 31 of the light guide 30 vertically to the pn joint surface, therefore, an oblong beam spot can be formed with the laser light turned back by the lateral face 31. Thus, the emission area can have a relatively elongated shape that is similar to that of a conventional light source using a filament. This makes the light distribution design easy when applying the laser light source device 1 to vehicle lamps, and enables use of optical components such as reflectors or lenses configured to match a filament light source without changing their designs. It should be noted that the semiconductor laser 10 of the present invention is not limited to those having oval beam spots. For example, the semiconductor laser 10 may make a circular beam spot, such as a surface emitting laser. When the semiconductor laser 10 creates a circular beam spot, the light source will likewise have a brightness distribution with the above-mentioned sharp increase in intensity.

Figure 8A:
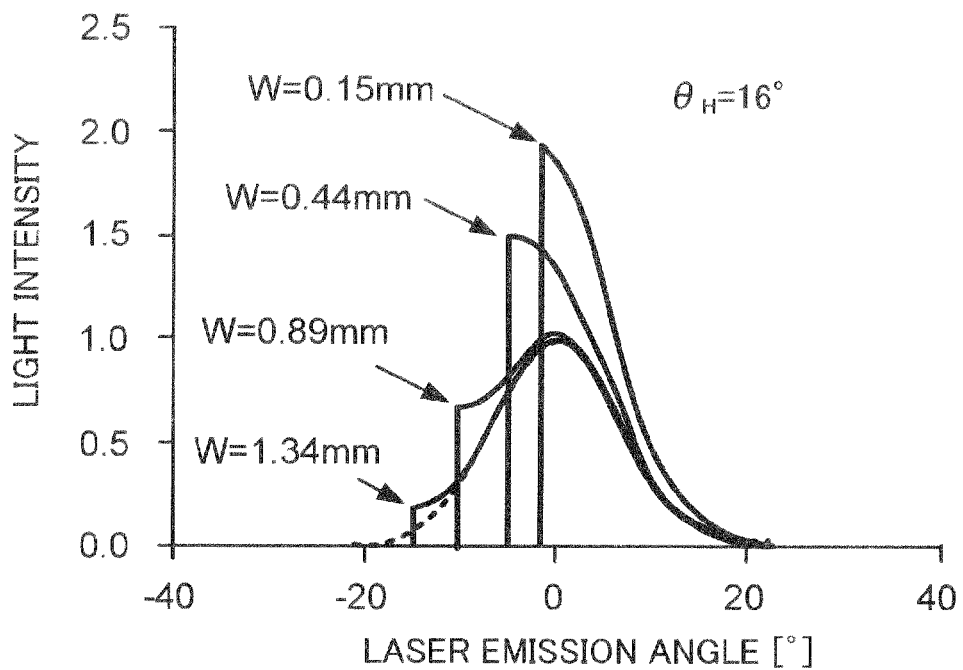
FIG. 8A is a chart showing the light intensity distribution of the beam spot formed on the light receiving surface of the fluorescent member when the distance W between the optical axis center and an lateral face of the light guide is varied in the laser light source device of FIG. 2.

FIG. 8A shows a light intensity distribution of a beam spot formed on the light receiving surface of the fluorescent member 40 with varying distance W between the optical axis center AX and the lateral face 31 of the light guide 30. In FIG. 8A, the horizontal axis represents the spread of light after being reflected by the lateral face 31 of the light guide 30 in a plane parallel to the pn joint surface of the laser diode 12. Thus, the emission angle 0° (degree) coincides with the optical axis center. The vertical axis in FIG. 8A represents the light intensity on the light receiving surface of the fluorescent member 40. The broken line curve represents a light intensity distribution of an imaginary case where there is no total reflection at the lateral face 31 of the light guide 30 (i.e., when there is no lateral face 31). The curves shown in FIG. 8A all represent the intensity distributions of laser light having a FWHM angle $\theta_H$ of 16° (degrees) in the direction parallel to the pn joint surface of the laser diode 12. Since the laser light is reflected by the lateral face 31 of the light guide 30 by total reflection, no light is emitted to the outside of the lateral face 31. Therefore, the angular position of the lateral face 31 of the light guide 30 corresponds to the end of the beam spot (emission area). The smaller the distance W between the optical axis center AX and the lateral face 31 of the light guide 30, i.e., the closer the light guide lateral face 31 is to the optical axis center AX, the higher the light intensity becomes at the end of the beam spot (emission area). When the distance W is 0.44 mm, for example, the light intensity has its peak at the end of the beam spot (emission area). When the distance W is 0.15 mm, the intensity peak can be made as high as about twice higher than when there is no lateral face 31.

Figure 8B:
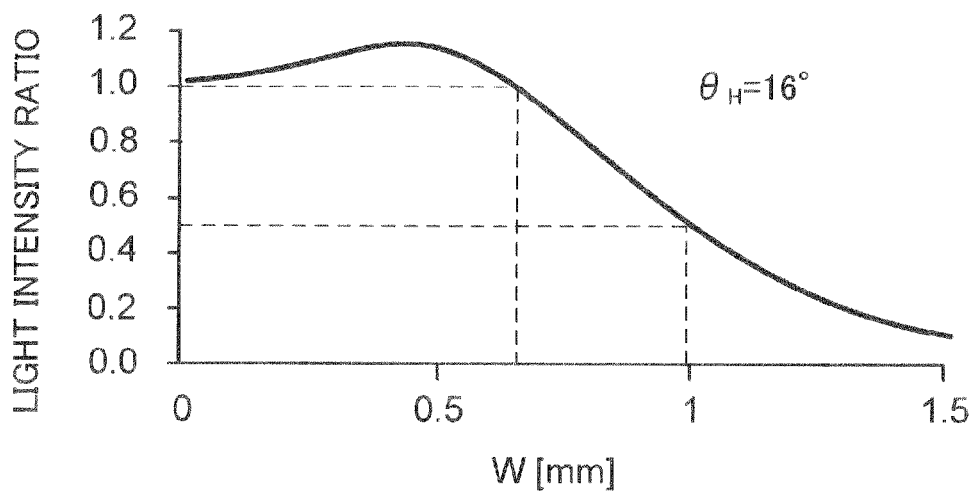
FIG. 8B is a chart showing the relationship between the light intensity ratio Ie/Ic and the distance W, where Ie represents light intensity at the end of the beam spot, Ic represents light intensity Ic at the optical axis center, and W represents the distance between the optical axis center and the lateral face of the light guide.

FIG. 8B shows the relationship between the ratio Ie/Ic between light intensity Ie at the end of the beam spot (emission area) and light intensity Ic at the optical axis center (emission angle of 0°), and the distance W between the optical axis center AX and the lateral face 31 of the light guide 30. The curve shown in FIG. 8B represents the characteristics of laser light having an FWHM angle $\theta_H$ of 16° (degrees) in the direction parallel to the pn joint surface of the laser diode 12. When the distance W is 0.7 mm or less, the light intensity peak can be formed at the end of the beam spot (emission area). When the distance W is more than 0.7 mm, the light intensity at the end of the beam spot (emission area) decreases with an increase in distance W. If the distance W is too long, that portion of the light intensity that illuminates a distant road surface will become lower, and the effect of improving the long distance visibility will be reduced, if the laser light source device 1 is applied to a vehicle lamp. To ensure the effect of improving the long distance visibility of the vehicle lamp, the ratio Ie/Ic between light intensity Ie at the end of the beam spot (emission area) and light intensity Ic at the optical axis center is preferably 0.5 or more. Therefore, as seen from the curve shown in FIG. 8B, the distance W between the optical axis center AX and the light guide lateral face 31 is preferably 0.99 mm or less. In the range where the Ie/Ic is more than 0.5 and less than 1.0, the turn back line TL does not coincide with the light intensity peak. In this case, the light image formed at the turn back line TL may be aligned with the cutoff line CL. With the ratio Ie/Ic being in the above-mentioned range, the effect (advantage) of the present invention can be achieved, as the light intensity peak is located close to the turn back line TL.

Figure 9:
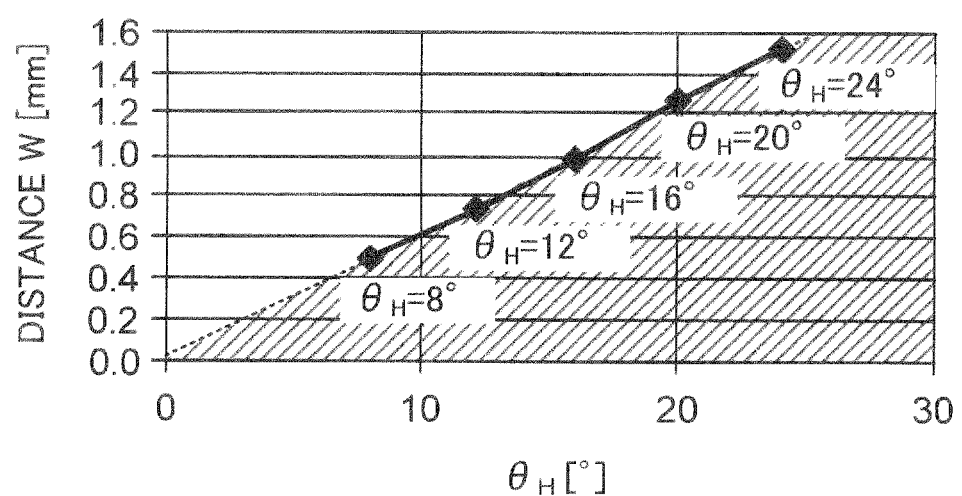
FIG. 9 shows a preferable range of distance W between the optical axis center and the lateral face of the light guide.

A similar analysis was made of other cases with laser light having FWHM angles $\theta_H$ other than 16° (degrees). FIG. 9 shows a plot of points where Ie/Ic=0.5 when the FWHM angle $\theta_H$ of laser light is 8°, 12°, 16°, 20°, and 24°. In FIG. 9, the horizontal axis represents the FWHM angle $\theta_H$ in a direction parallel to the pn joint surface of the laser diode 12, and the vertical axis represents the distance W between the optical axis center AX and the lateral face 31 of the light guide 30. The points plotted in FIG. 9 indicate the maximum values of distance W necessary for securing the effect of improving the long distance visibility of the vehicle lamp. A proportional relationship can be established by approximation between the maximum values $W_{max}$ of distance W and the FWHM angles $\theta_H$ of laser light. Specifically, the straight line drawn through the plotted points shown in FIG. 9 can be expressed as $W_{max}=0.064\theta_H-0.032$. Therefore, the preferable setting range of distance W is $W<0.064\theta_H-0.032$ [mm], which is the region hatched in FIG. 9. It is understood from FIG. 9 that the lateral face 31 of the light guide 30 is arranged at a position within a distance of no more than 1 mm from the optical axis center AX when the laser light has an FWHM angle $\theta_H$ of 16° (degrees), for example.

As is clear from the foregoing description, the light guide 30 forming the optical path of laser light in the laser light source device 1 of this embodiment has a lateral face 31 parallel to the optical axis of the laser light at a position outer than the laser emission aperture 12a of the laser diode 12. As the lateral face 31 of the light guide 30 defines a reflective surface that reflects laser light propagating through the light guide 30 by total reflection, the laser light is turned back by the lateral face 31, and a beam spot having a different light intensity distribution from the original light intensity distribution can be formed. Specifically, the light intensity can be increased near the turn back line TL which is at the end of the beam spot (emission area). By making the lateral face 31 of the light guide 30 closer to the optical axis center AX, the light intensity peak can be formed on the turn back line TL. In an application of this laser light source device 1 having such a light intensity distribution as the light source of a vehicle lamp, an optical system may be configured to form a projected image in which the turn back line TL corresponding to an end of the emission area runs along the cutoff line CL, so as to achieve a light emission distribution with uniform illuminance both in the vicinity of the vehicle and in a distance. As a result, the long distance visibility can be improved. Also, the difference between bright parts (brighter area) on one side of a bright/dark boundary and dark parts (darker area) on the other side of the bright/dark boundary can be made distinct, even without using a light shield member such as a shade.

Embodiment 2

Figure 10A:
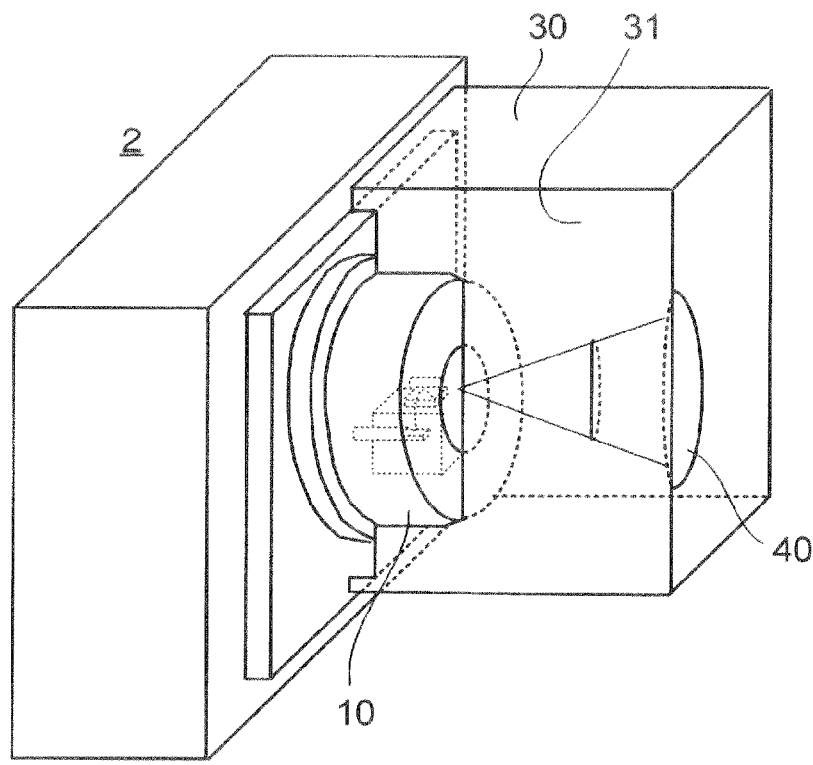
FIG. 10A is a perspective view of a laser light source device according to Embodiment 2 of the present invention.
Figure 10B:
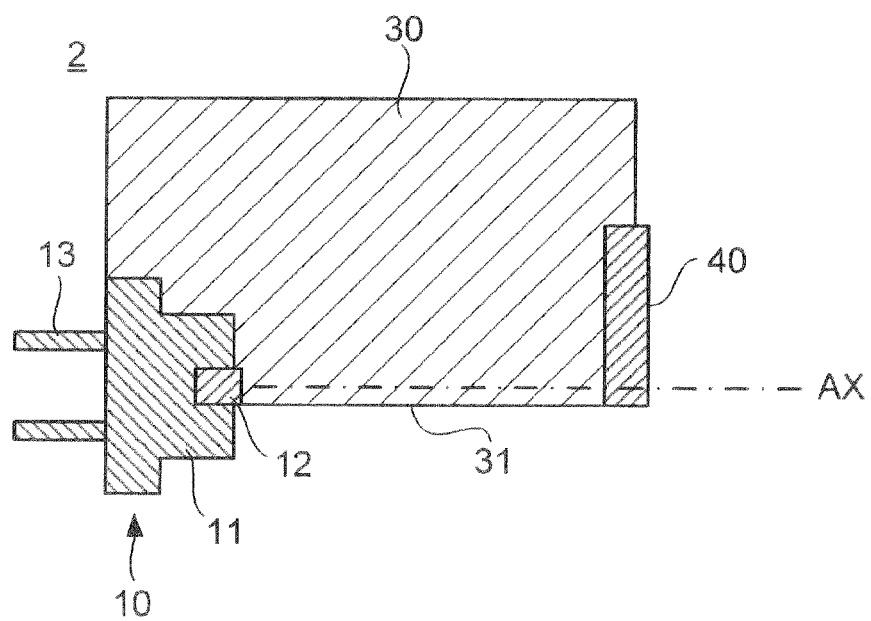
FIG. 10B is a cross-sectional view of the laser light source device shown in FIG. 10A.

Referring to FIG. 10A and FIG. 10B, a laser light source device 2 according to a second embodiment of the present invention will be described. FIG. 10A is a perspective view of the laser light source device 2, and FIG. 10B is a cross-sectional view. Like reference numerals are used to designate like elements and parts in the first and second embodiments. It is understood from the comparison between FIG. 10A (second embodiment) and FIG. 2 (first embodiment) that the fluorescent member 40 of the laser light source device 2 is disposed at the position where the condenser lens 20 of the laser light source device 1 is disposed. In the second embodiment, therefore, the fluorescent member 40 is disposed in front of the semiconductor laser 10 in the laser emission direction, so that the laser light emitted from the semiconductor laser 10 is directly projected on the light receiving surface of the fluorescent member 40 without passing through a condenser lens.

The light guide 30 forms the optical path of laser light from the semiconductor laser 10 to the fluorescent member 40. The light guide 30 fills up the space between the semiconductor laser 10 and the fluorescent member 40, so that light emitted from the semiconductor laser 10 enters and propagates in the light guide 30, and reaches the fluorescent member 40. The semiconductor laser 10 and/or the fluorescent member 40 may be partly embedded in the light guide 30. If the fluorescent member 40 is positioned too long a distance from the semiconductor laser 10, the beam spot formed on the light receiving surface of the fluorescent member 40 will be too large, which may make the light distribution designing difficult. Therefore, the distance between the semiconductor laser 10 and the fluorescent member 40 is preferably set (decided) in accordance with the FWHM angle of the laser light emitted from the semiconductor laser 10. If the laser light has an FWHM angle $\theta_H$ of 16° (degrees), for example, in the direction parallel to the pn joint surface of the laser diode 12, the distance between the semiconductor laser 10 and the fluorescent member 40 is preferably about 5 mm. The fluorescent member 40 extends to the lateral face 31 of the light guide 30 so that the fluorescent member 40 can take in light that reaches near the lateral face 31 of the light guide 30. It is not desirable that the laser light spreading in a region on the opposite side from the lateral face 31 relative to the optical axis reach the fluorescent member 40 by reflection. In order to prevent light from being reflected, therefore, the surface opposite the lateral face 31 of the light guide 30 is preferably processed to be antireflective, for example by providing (attaching) a light absorbing film, or, be distanced 5 mm or more, for example, from the optical axis, so that light within the HWHM angle range spreading in the region opposite from the lateral face 31 will reach the fluorescent member 40 without being reflected. Thus, the fluorescent member 40 is preferably located and dimensioned such that light within the HWHM angle range spreading on the side of the lateral face 31 will reach the fluorescent member 40 by being reflected once by the lateral face 31, and light within the HWHM angle range spreading in the region opposite from the lateral face 31 will reach the fluorescent member 40 without being reflected. The location of the lateral face 31 of the light guide 30 will not be described again as it is disposed similarly to that of the laser light source device 1 of the first embodiment.

Thus the laser light source device 2 of this embodiment is configured to project the laser light emitted from the semiconductor laser 10 directly to the fluorescent member 40 and not through a condenser lens, so that white light is emitted from the fluorescent member 40. Such a configuration can generate diffusion light spreading in a direction orthogonal to (or crossing) the laser emission direction (i.e., in a lateral direction). While the laser light source device 1 of the first embodiment is suitable as the light source of vehicle front lamps that illuminate a distant road surface, the laser light source device 2 of this embodiment is suitable as the light source of fog lamps for illuminating the road surface in a wider angle in the left and right directions. Similar to the first embodiment, the laser light source device 2 of this embodiment is capable of illuminating the road surface from near the vehicle to a long distance with substantially uniform illuminance. Due to restrictions on installation of lamps, fog lamps have to be installed at a lower position of the vehicle than the head lamps. Therefore, with a conventional light source having a Gaussian light intensity distribution, the intensity of light illuminating a long distance is low, and much of the light is concentrated to a closer road surface. The light source device 2 of the present invention can be advantageously applied also to fog lamps as it provides better long distance visibility.

Figure 11:
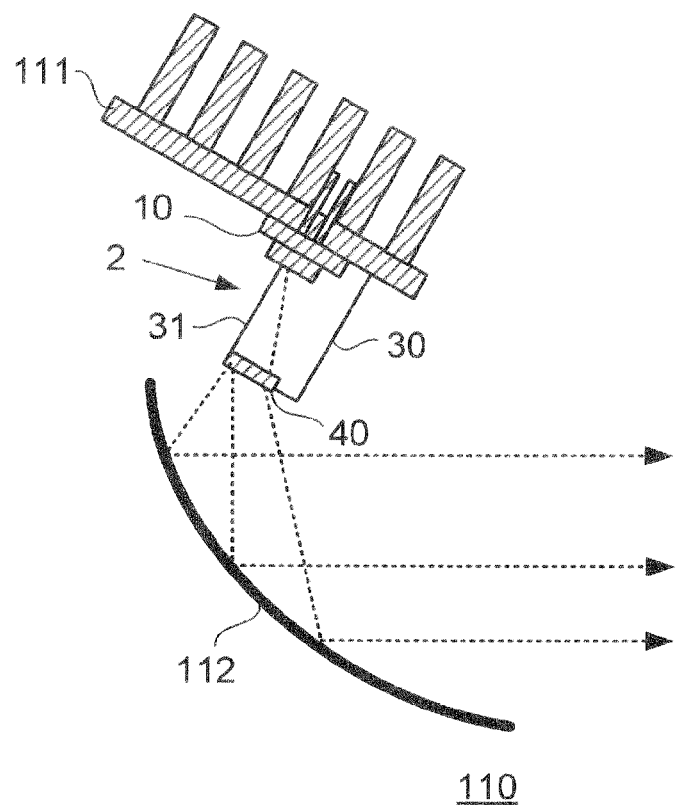
FIG. 11 shows the configuration of a reflector-type vehicle lamp having the laser light source device shown in FIG. 10A.

FIG. 11 illustrates a reflector-type vehicle lamp 110 having the laser light source device 2 of the second embodiment that does not have a condenser lens. The laser light source device 2 is disposed such that the lateral face 31 of the light guide 30 faces backward in the light projection direction, and the light exit surface of the fluorescent member 40 faces the light reflecting surface of the reflector 112. The reflector 112 that is part of the optical system has a paraboloidal light reflecting surface with a focal point being close to the fluorescent member 40. The reflective surface of the reflector 112 has a so-called multi-reflector structure formed by a plurality of unit reflective surfaces. The reflector 112 is disposed below the laser light source device 2 so that the light reflecting surface thereof faces the light exit surface of the fluorescent member 40, and the light emitted from the fluorescent member 40 is reflected toward the front in the light projection direction.

Embodiment 3

Figure 12:
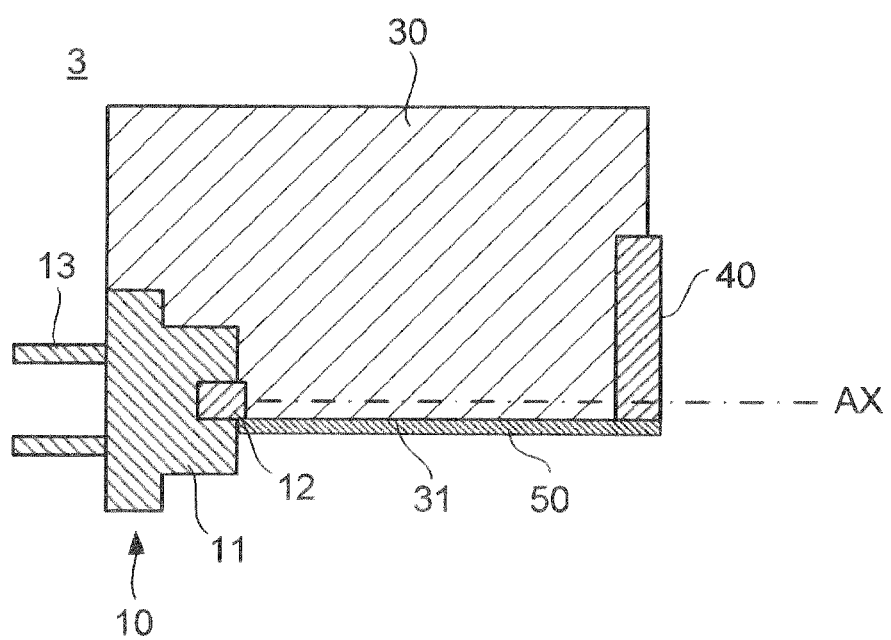
FIG. 12 is a cross-sectional view of a laser light source device according to Embodiment 3 of the present invention.

Referring to FIG. 12, a laser light source device 3 according to a third embodiment of the present invention will be described. FIG. 12 is a cross-sectional view of the laser light source device 3. The third embodiment is a modification to the second embodiment, and like reference numerals are used to designate like elements and parts in the second and third embodiments. The laser light source device 3 is different from the laser light source device 2 of the second embodiment in that it further includes a reflective film 50 that covers the lateral face 31 of the light guide 30. The reflective film 50 may be formed of metal having a high reflectance such as Ag or Al. The constituent elements of the laser light source device 3 of the third embodiment other than the reflective film 50 are the same as those of the laser light source device 2 of the second embodiment and so these will not be described again.

Of the laser light propagating through the light guide 30, those light beams entering the lateral face 31 at an angle of the optimal angle or more are reflected by the lateral face 31 by total reflection, due to a difference in the refractive index between the light guide 30 and the air. Those light beams entering the lateral face 31 at an angle smaller than the optimal angle transmit the lateral face 31 and exit to the outside. If the fluorescent member 40 contains a binder made of resin, the light reflected by the light receiving surface of the fluorescent member 40 will likely be emitted to the outside after entering the lateral face 31 of the light guide 30 at an angle smaller than the optimal angle. By covering the lateral face 31 of the light guide 30 with the reflective film 50, such otherwise-transmitted light can be returned into the light guide 30, so that the light utilization efficiency is improved, and the eye safety is increased.

It should be noted that although the third embodiment is applied to the laser light source device 2 of the second embodiment, this is only one example, and addition of the reflective film may also be applied to the light source device 1 of the first embodiment that has a condenser lens. In such modification, the light source device 1 may include a reflective film covering the lateral face 31 of the light guide 30. Alternatively, the light guide 30 may be omitted, and a reflective surface element alone may be provided at a position where the lateral face 31 would be. This modification can also possess the light intensity distribution shown in FIG. 4A. There would only be some space without any reflective surface in the region within 5 mm from the optical axis on the opposite side of the reflective surface element. However, as there are more production challenges to provide a reflective surface element near the laser emission aperture 12 without using the light guide 30, it would be more advantageous in terms of production to use the light guide 30 and provide a reflective film on the light guide 30.

Embodiment 4

Figure 13A:
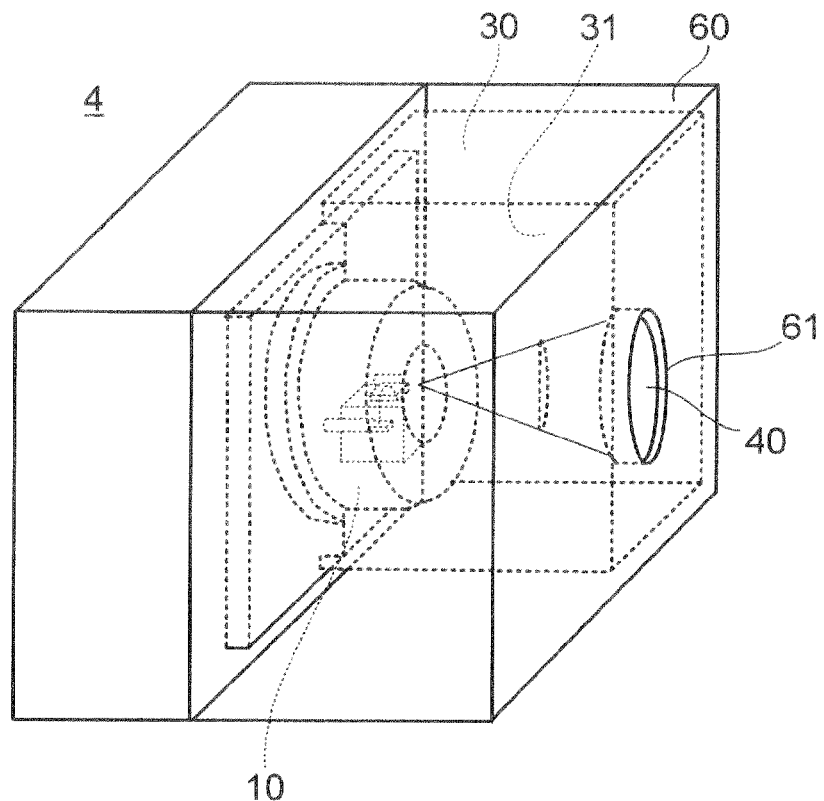
FIG. 13A is a perspective view of a laser light source device according to Embodiment 4 of the present invention.
Figure 13B:
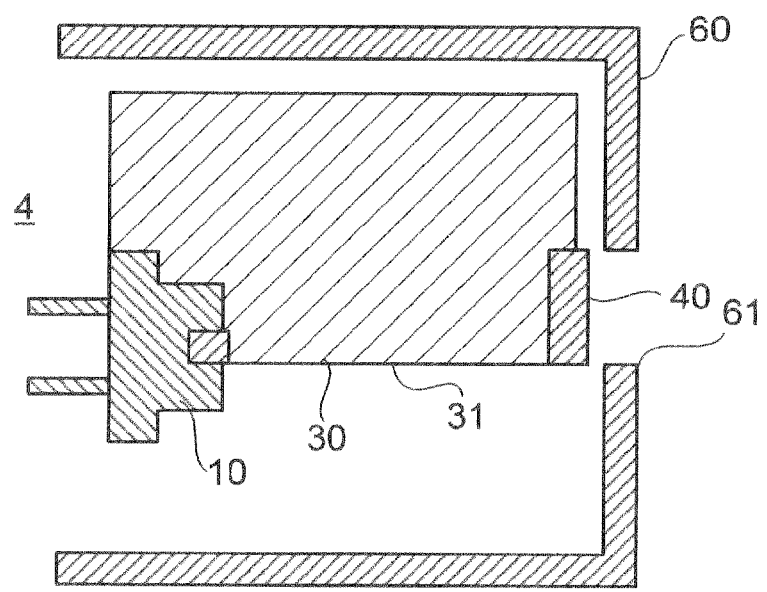
FIG. 13B is a cross-sectional view of the laser light source device shown in FIG. 13A.

Referring to FIG. 13A and FIG. 13B, a laser light source device 4 according to a fourth embodiment of the present invention will be described. FIG. 13A is a perspective view of the laser light source device 4, and FIG. 13B is a cross-sectional view of the laser light source device 4. The fourth embodiment is another modification to the second embodiment, and like reference numerals are used to designate like elements and parts in the second and fourth embodiments. The laser light source device 4 is different from the laser light source device 2 of the second embodiment in that it further includes a light shield 60 entirely covering the outside of the light guide 30. The light shield 60 is formed of a material having light shielding properties such as metal or resin to prevent the laser light that has transmitted through the light guide 30 from being emitted to the outside. The light shield 60 has an aperture 61 at a position where the fluorescent member 40 is located, so that the white light emitted from the fluorescent member 40 can exit from the aperture 61. The aperture 61 is formed to have the same size as, or a smaller size than the fluorescent member 40. Surrounding the outside of the light guide 30 entirely by the light shield 60 in this way can prevent the occurrence of glare caused by stray light from inside the light guide 30.

While the configuration of the light source device 4 (i.e., addition of the light shield) is applied to the laser light source device 2 of the second embodiment, this is only one example, and it may also be applied to the light source device 1 of the first embodiment that has the condenser lens 20. In such modification, the light source device 1 may further include the light shield covering the outside of the light guide 30.

It should be noted that the present invention is not limited to the above-described configurations. For example, the configurations of the above-described various embodiments and modifications may be combined as desired, as long as it functions properly.

This application is based on Japanese Patent Application No. 2011-254936 filed on Nov. 22, 2011, and the entire disclosure thereof is incorporated herein by reference.

What is claimed is:

1. A laser light source device comprising:
   a laser light source for emitting laser light through a laser emission aperture thereof;
   a condenser lens disposed in front of said laser light source in a laser emission direction to collect said laser light; and
   a light guide covering said laser emission aperture so as to guide said laser light, said light guide having a reflective surface, and said reflective surface extending from said laser light source to said condenser lens such that said reflective surface extends along an optical axis of said laser light;
   wherein said laser light source includes a laser diode having a pn joint surface and said reflective surface is oriented in a direction orthogonal to the pn joint surface of the laser diode;
   wherein said light guide has a second surface which is located opposite to said reflective surface with respect to the optical axis of said laser light, said second surface having one of (i) an antireflective property, and (ii) a sufficient separation distance from the optical axis of said laser light so as not to reflect said laser light; and
   wherein said laser light source device satisfies the following inequality:

$W<0.064\theta_H-0.032$ where $\theta_H$ is a full width at half maximum angle in degrees of said laser light in a direction parallel to the pn joint surface of said laser diode, and W is a distance in millimeters between an optical axis center of said laser light and said reflective surface.

2. The laser light source device according to claim 1, wherein said reflective surface is defined by a lateral face of said light guide.

3. The laser light source device according to claim 2, further comprising a reflective film having a light reflection property for covering the lateral face of said light guide.

4. The laser light source device according to claim 1, wherein said reflective surface extends in a direction parallel to the optical axis of said laser light.

5. The laser light source device according to claim 1, wherein said light guide is made of glass or resin, and at least one of said laser light source and said condenser lens is partly embedded in said light guide.

6. The laser light source device according to claim 1, further comprising a light shield surrounding an outside of said reflective surface.

7. The laser light source device according to claim 1, wherein said reflective surface extends near the optical axis of said laser light.

8. The laser light source device according to claim 1, wherein said second surface is distanced at least 5 millimeters from the optical axis of said laser light.

9. A laser light source device, comprising:
   a laser light source for emitting laser light from a laser emission aperture thereof;
   a wavelength converter disposed in front of said laser light source in a laser emission direction to receive said laser light and to emit light of a different wavelength from that of said laser light; and a light guide covering said laser emission aperture so as to guide said laser light, said light guide having a reflective surface, and said reflective surface extending from said laser light source to said wavelength converter along an optical axis of said laser light;

wherein said laser light source includes a laser diode having a pn joint surface and said reflective surface is oriented in a direction orthogonal to the pn joint surface of the laser diode;

wherein said light guide has a second surface which is located opposite to said reflective surface with respect to the optical axis of said laser light, said second surface having one of (i) an antireflective property, and (ii) a sufficient separation distance from the optical axis of said laser light so as not to reflect said laser light; and wherein said laser light source device satisfies the following inequality:

$$W < 0.064\theta_H - 0.032$$

where $\theta_H$ is a full width at half maximum angle in degrees of said laser light in a direction parallel to the pn joint surface of said laser diode, and W is a distance in millimeters between an optical axis center of said laser light and said reflective surface.

10. The laser light source device according to claim 9, wherein said reflective surface is defined by a lateral face of said light guide.

11. The laser light source device according to claim 10, further comprising a reflective film having a light reflection property for covering the lateral face of said light guide.

12. The laser light source device according to claim 9, wherein said reflective surface extends in a direction parallel to the optical axis of said laser light.

13. The laser light source device according to claim 9, wherein said light guide is made of glass or resin, and at least one of said laser light source and said wavelength converter is partly embedded in said light guide.

14. The laser light source device according to claim 9, further comprising a light shield surrounding an outside of said reflective surface.

15. The laser light source device according to claim 9, wherein said reflective surface extends near the optical axis of said laser light.

16. The laser light source device according to claim 9, wherein said second surface is distanced at least 5 millimeters from the optical axis of said laser light.

* * * * *